(12) United States Patent
Born et al.

(10) Patent No.: US 7,977,596 B2
(45) Date of Patent: Jul. 12, 2011

(54) CONTROL ELEMENT WITH PROXIMITY SENSOR

(75) Inventors: Frank Born, Ober-Mörlen (DE); Norbert Mankel, Marburg (DE); Joerg Reinhardt, Lahnau (DE); Stefan Schaefer, Wetzlar (DE); Dirk Wüstenbecker, Asslar (DE)

(73) Assignee: Siemens Aktiengesellschaft, München (DE)

( * ) Notice: Subject to any disclaimer, the term of this patent is extended or adjusted under 35 U.S.C. 154(b) by 316 days.

(21) Appl. No.: 11/472,657

(22) Filed: Jun. 22, 2006

(65) Prior Publication Data

US 2006/0289286 A1 Dec. 28, 2006

(30) Foreign Application Priority Data

Jun. 24, 2005 (DE) .......................... 10 2005 029 512

(51) Int. Cl.
*H03K 17/975* (2006.01)
(52) U.S. Cl. ....................................................... 200/600
(58) Field of Classification Search .................. 200/600
See application file for complete search history.

(56) References Cited

U.S. PATENT DOCUMENTS

| | | | |
|---|---|---|---|
| 3,823,355 A | 7/1974 | Batz | |
| 4,380,040 A * | 4/1983 | Posset | 200/600 |
| 4,472,758 A * | 9/1984 | Goto et al. | 200/600 |
| 4,584,444 A | 4/1986 | Nagashima | |
| 4,849,852 A | 7/1989 | Mullins | |
| 5,367,136 A * | 11/1994 | Buck | 200/600 |
| 5,889,507 A | 3/1999 | Engle | |
| 6,046,659 A * | 4/2000 | Loo et al. | 333/262 |
| 6,440,767 B1* | 8/2002 | Loo et al. | 438/52 |
| 7,060,923 B2* | 6/2006 | Pihlaja | 200/512 |
| 7,166,813 B2* | 1/2007 | Soma et al. | 200/600 |
| 7,255,466 B2* | 8/2007 | Schmidt et al. | 362/501 |
| 2003/0169231 A1 | 9/2003 | Rekimoto | |
| 2007/0064112 A1 | 3/2007 | Chatting et al. | |

FOREIGN PATENT DOCUMENTS

| | | |
|---|---|---|
| DE | 100 15 726 | 10/2001 |
| DE | 103 42 666 | 4/2005 |

OTHER PUBLICATIONS

German Office Action dated Mar. 30, 2007 issued in corresponding foreign application 10 2005 029 512.6.

* cited by examiner

*Primary Examiner* — Renee Luebke
*Assistant Examiner* — Lheiren Mae Caroc
(74) *Attorney, Agent, or Firm* — Cohen Pontani Lieberman & Pavane LLP

(57) ABSTRACT

A control element includes a switching element, an operating element for operating the switching element, a printed circuit board, and an electrically conductive sensor element of a capacitive proximity sensor integrated in the operating element. The electrically conductive sensor element is designed to be electrically conductively connected to the printed circuit board.

13 Claims, 4 Drawing Sheets

Key movement

CONTROL ELEMENT WITH PROXIMITY SENSOR

BACKGROUND OF THE INVENTION

The invention relates to a control element, particularly for a motor vehicle component, having an operating element which is mounted so as to move in a support element and which acts on a switching element, in particular.

To control motor vehicle components, such as in a radio appliance, in a navigation appliance, in a car telephone, in a multimedia installation and the like, control and display devices are frequently used which are arranged ergonomically in the vehicle. In this case, the display device should be arranged such that the driver can observe it with as little diversion from the road traffic as possible. The display unit is therefore preferably arranged in the region of the dashboard or in the upper region of a central console. The control unit is preferably arranged such that the driver can reach it with his fingers without a relatively great arm movement. However, this arrangement of the control unit has the drawback that the control unit can be observed visually only very poorly. The driver will therefore frequently feel his way to and select the control elements on the control unit without any visual contact. It is therefore desirable to detect the approach of the driver's hand to a control element, for example in order to be able to output advice of the type of control element or the function to be controlled thereby on the display device or else an audible acknowledgement before the control element has been operated and the action linked to it has been executed.

SUMMARY OF THE INVENTION

It is therefore an object of the invention to provide a control element which identifies an approach to the control element, but at the same time provides the conventional functionality of a control element without restrictions.

According to a preferred embodiment of the present invention, the control element includes a switching element, an operating element for operating the switching element, a printed circuit board, and an electrically conductive sensor element of a capacitive proximity sensor integrated in the operating element. The electrically conductive sensor element is designed to be electrically conductively connected to the printed circuit board. The sensor element being integrated in the operating element means that the sensor element either forms part of the operating element or is arranged inside the operating element. In any case, however, the sensor element cannot be identified by the user and therefore in no way adversely affects the visual appearance of the control element. The corresponding electrically conductive connection of the sensor element to the printed circuit board allows a sensor signal from the sensor element to be forwarded easily to signal-processing elements, which can be arranged on the printed circuit board. A suitable arrangement of the sensor element as a part of or within the operating element and a suitable connection of the sensor element to the printed circuit board ensure that the conventional functionality of the control element, which can particularly be formed as a pushbutton switch, is not adversely affected.

The sensor element may be formed as an angled, elastically deformable metal element or metal-coated plastic element which has a first and a second leg, wherein the first leg projects into the operating element and is fixedly connected thereto, and the second leg is supported on a conductive face of the printed circuit board on a side of the printed circuit board which faces the operating element. This ensures that the sensor element is securely connected to the printed circuit board. Even when the operating element is operated, particularly when an operating element of a pushbutton switch is pressed, the elastically deformable configuration of the metal element or of the metal-coated plastic element ensures reliable contact with the printed circuit board in all phases of the operation of the control element.

The sensor element may be formed as an angled, elastically deformable metal element which has a first leg and a second leg, wherein the first leg is fixedly connected to the printed circuit board and the second leg acts on an inner front portion of the operating element as a spring element. In this arrangement, the sensor element simultaneously brings about the returning of the operating element of the pushbutton switch into the position of rest, so that this requires no additional elements such as a spring or an elastic rubber element. The space required by a control element, which is small anyway, can be even lowered as a result of this combination of sensor element and returning element.

The sensor element may have a portion which is provided with a metal coating, projects through the printed circuit board and, in a position in which the pushbutton switch is at rest, rests against a conductive face of a side of the printed circuit board which is remote from the operating element. The sensor element and possibly also an additional element for field orientation are in this case implemented by means of a two-component operating element with a partly metal coating. In this case, the electrical connection of the sensor element to the printed circuit board is likewise made via the metal-coated region of the operating element. The operating element and the sensor element are therefore of integral design, so that additional assembly complexity is not required.

The sensor element may be arranged on an internal surface of the operating element as a metal coating, and the electrical connection to the printed circuit board may be established by means of a sliding contact element which is fixedly connected to the printed circuit board. In this context, the operating element for a pushbutton switch is formed as a two-component injection-molded part. Further, one of the components is chosen such that its surface may be coated so as to be metallically conductive. The metal coating is the actual sensor element. Contact to the printed circuit board is established by means of a sliding contact element which is fixedly connected to the printed circuit board and rests against the metal coating of the operating element. The sensor element can therefore also be produced in complex geometries which cannot be produced in a stamping process for a metal element, for example.

The sensor element may be fixedly connected to the operating element, with a subregion of the sensor element projecting into a metal-coated recess in the printed circuit board and resting against the metal coating. The metal-coated recess may, in particular, be a through hole in the printed circuit board. In this case too, contact is established between the printed circuit board and the sensor element in the form of a sliding contact. The sensor element itself may be formed as a separate metal element or a conductive coating for a two-component plastic key.

In another embodiment, the switching element may contain a switching mat arranged on the printed circuit board, the sensor element may have been arranged on the operating element as a metal coating, and the switching mat may have an electrically conductive layer which is connected both to the conductive coating of the operating element and to the printed circuit board. The use of an electrically conductive plastic material for subregions of the operating element and of a conductive coating, connected thereto, for a switching mat in the form of a switching element provides a simple way of establishing a conductive connection between the sensor element and the printed circuit board. In particular, this embodiment allows the operating element to engage on the side of the switching mat opposite to the operating element, with the conductive coating of the operating element, in a position in which the control element is at rest, resting against the electrically conductive layer of the switching mat. In this case, the switching mat is simultaneously used as a stop for the operating element in the position of rest, its rubber-like material simultaneously ensuring noise damping when the key is returned from the operating position to the position of rest.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

BRIEF DESCRIPTION OF THE DRAWINGS

The invention is explained in more detail below with reference to exemplary embodiments and the drawings, in which.

DETAILED DESCRIPTION OF THE PRESENTLY PREFERRED EMBODIMENTS

Figure 1:
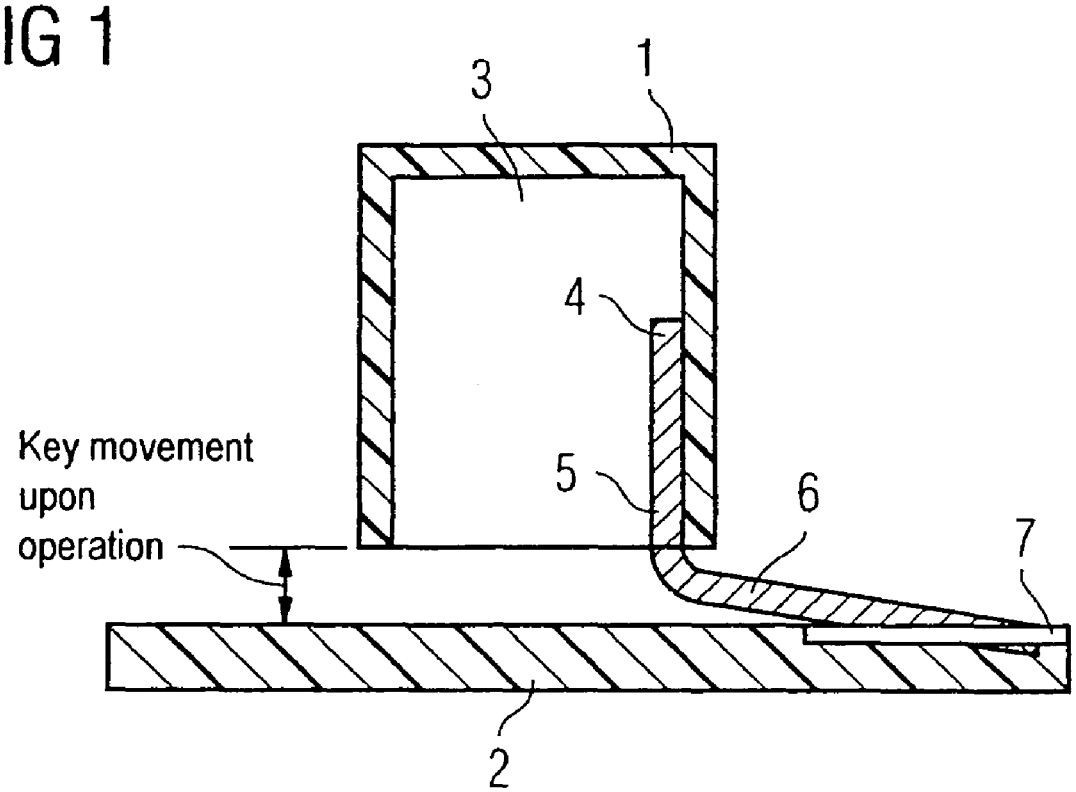
FIG. 1 is a sectional view of a first embodiment of a pushbutton switch with a sensor element formed as an angled metal element according to the invention.

FIG. 1 schematically shows a control element formed as a pushbutton switch with a linearly moving operating element 1 which is mounted in conventional fashion in a support element (not shown here) so as to move linearly. Pressure on the operating element 1 moves it toward the printed circuit board 2. The operating element 1 may be returned to the position of rest by a spring element (likewise not shown), for example. The operating element 1 has an interior space 3. Projecting into the interior space 3 of the operating element 1 is a first leg 4 of an angled and elastically deformable metal element 5. The first leg 4 is firmly connected to the operating element 1, which is made of a plastic material. A second leg 6 is arranged at an angle of slightly more than 90 degrees relative to the first leg 4 and is supported on a conductive face 7 of the printed circuit board 2. The second leg 6 is electrically connected to the printed circuit board 2 by means of snap-in hooks.

When the operating element 1 is pressed, the metal element 5 adapts to the movement, that is to say that the angle between the first leg 4 and the second leg 6 becomes slightly smaller. When the operating element 1 is released, the spring action of the metal element 5 assists the returning of the operating element 1 to the position of rest. The metal element 5 is the sensor element of a capacitive proximity sensor, where, by way of example, changes in capacitance between the sensor element (metal element 5) and a ground element occur, in a manner which is known per se, when a hand approaches the operating element 1, and are evaluated in an evaluation circuit.

Figure 2:
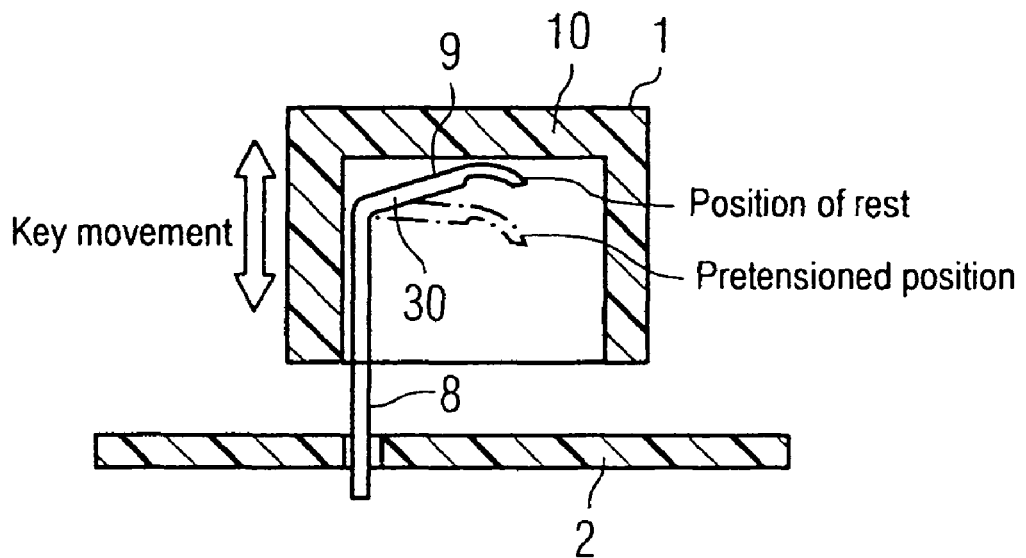
FIG. 2 is a sectional view of a second embodiment of a pushbutton switch with a metal sensor element formed as a spring element according to the invention.

FIG. 2 schematically shows a second embodiment of a pushbutton switch according to the invention. In this context, the sensor element is in turn formed as an angled, elastically deformable metal element 30, but now a first leg 8 is fixedly connected to the printed circuit board and a second leg 9 acts on an inner front portion 10 of the operating element 1 as a spring element. FIG. 2 shows both the position of rest and the pretensioned operating position (in dashes) of the second leg 9. The pretensioned position is obtained when the operating element 1 is depressed. Additional components for returning the operating element 1 from the operating position to the position of rest are not required in this embodiment.

Figure 3:
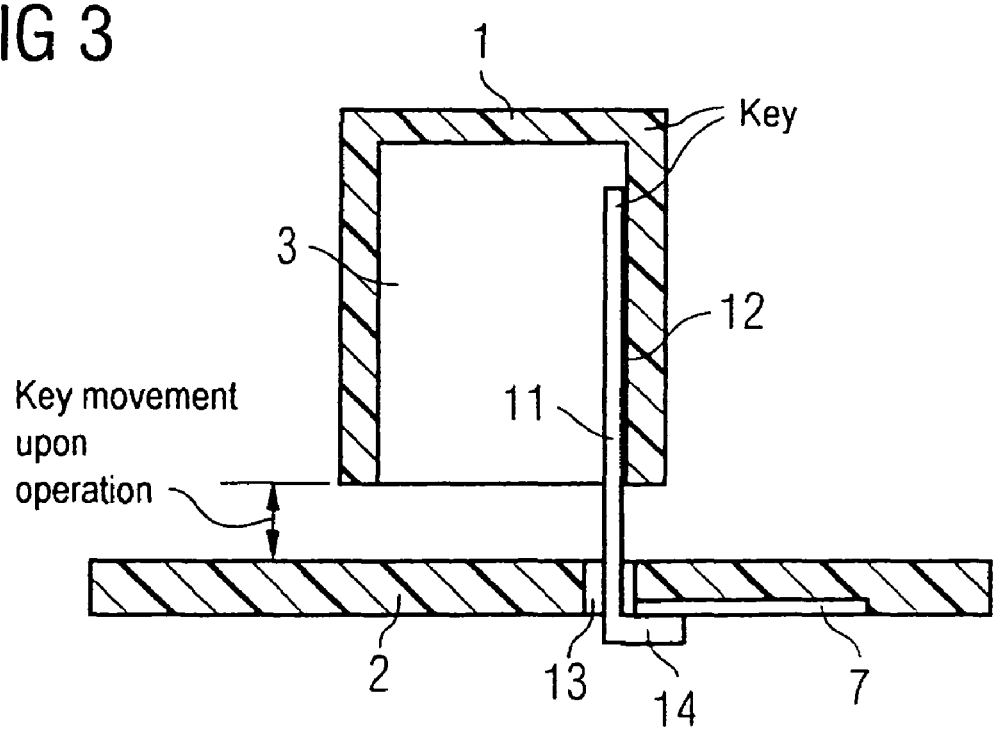
FIG. 3 is a sectional view of a third embodiment of a pushbutton switch in which the sensor element projects through the printed circuit board according to the invention.

FIG. 3 schematically shows another refinement of a pushbutton switch, where the sensor element is formed as a portion 12 of the operating element 1, the portion being provided with a metal coating 11. The sensor element portion 12 projects through an opening 13 in the printed circuit board 2 and has an angled end 14 abutting against a conductive face 7 of the printed circuit board 2, the conductive face 7 being arranged on the side of the printed circuit board 2 which is remote from the operating element 1. The conductive coating 11 of the sensor element portion 12 of the operating element 1 therefore firstly results in the formation of the sensor element itself and secondly also ensures a reliable contact with the conductive face 7 of the printed circuit board 2 in the position in which the operating element 1 is at rest. In a position in which the operating element 1 is being operated, on the other hand, there is no contact between the sensor element and the printed circuit board. This is also not necessary, however, since at this time it is not necessary to detect an approach. The partial metalization of the operating element 1 and the use of this metalized face both for the sensor element and for orienting the field allow the entire sensor system to be produced in a very space-saving manner. In particular, in this embodiment, the interior space 3 is preoccupied only insignificantly by the additional arrangement of the sensor element of the capacitive proximity sensor and can therefore accommodate insertable illumination elements and the like in an almost unchanged manner.

Figure 4:
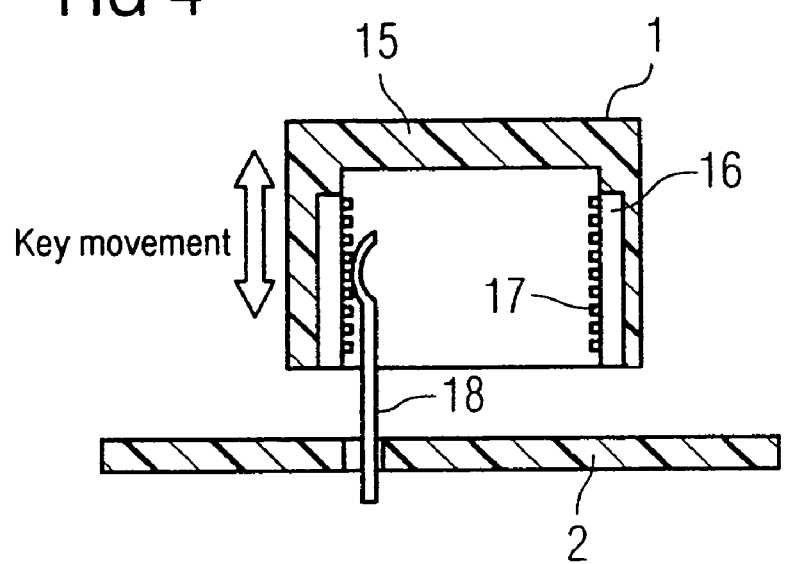
FIG. 4 is a sectional view of a fourth embodiment of a pushbutton switch with a metal coating and a sliding contact connection according to the invention.

FIG. 4 shows another embodiment, in which the operating element 1 is formed as a two-component plastic part. In this context, a first key component 15 is made of a nonmetalizable plastic, while a second key component 16 is made of a metalizable plastic. A conductive coating 17 is layered onto the second key component 16, which represents the actual sensor element of the capacitive proximity sensor. The printed circuit board 2 has a sliding contact element 18 fixedly connected to it, the sliding contact element 18 additionally resting against the conductive coating 17. By means of the sliding contact element 18 it is ensured that during the operation of the key a reliable connection between the conductive coating 17 and the printed circuit board 2 is maintained.

Figure 5:
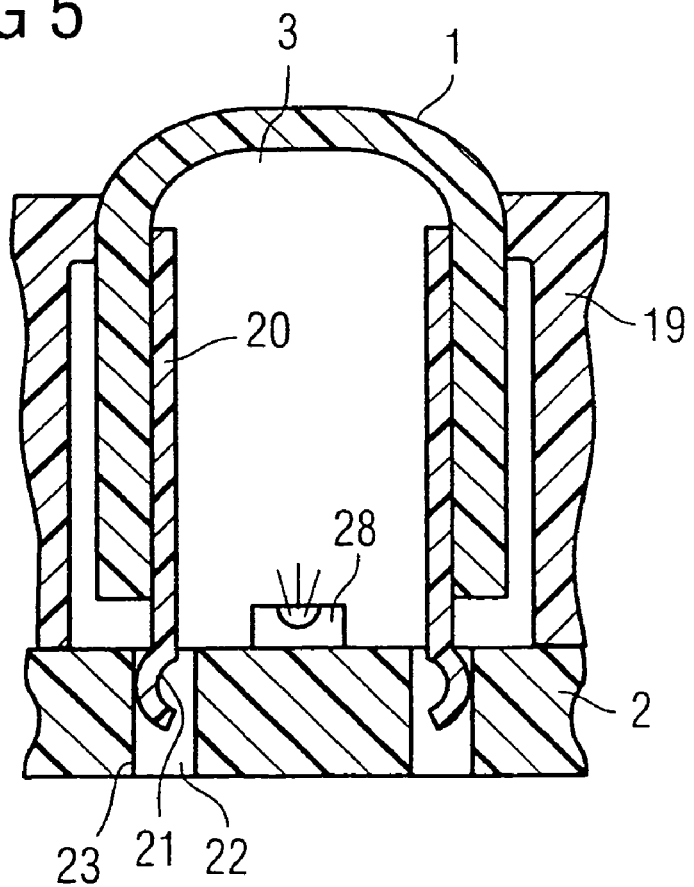
FIG. 5 is a sectional view of a fifth embodiment of a pushbutton switch with a sliding contact connection in a recess in the printed circuit board according to the invention.

FIG. 5 shows another embodiment of a pushbutton switch, where the operating element 1 is arranged and guided in a faceplate 19. The electrically conductive sensor element 20 is fixedly connected to the inside wall of the operating element 1. A subregion 21 of the sensor element 20 projects into a recess 22 in the printed circuit board 2, the recess 22 having a metal coating 23. The sensor element 20 may be formed as a conductive metal element or as a conductive region of a two-component operating element.

Figure 6:
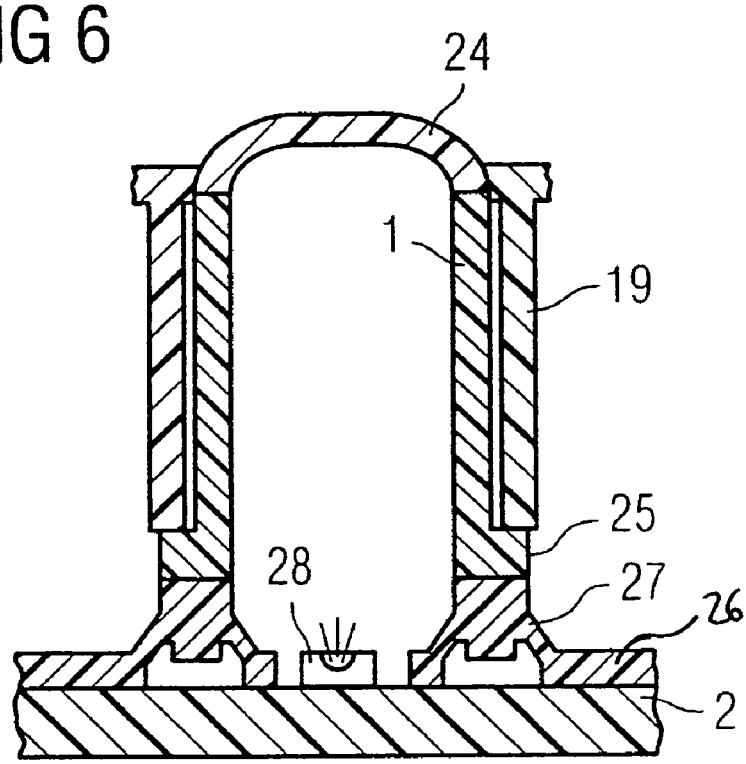
FIG. 6 is a sectional view of a sixth embodiment with a coated switching mat according to the invention.

FIG. 6 shows another exemplary embodiment, in which the operating element 1 comprises two subregions, a nonconductive subregion 24 and a conductive subregion 25. The conductive subregion 25 is in contact with a switching mat 26 which is arranged on the printed circuit board 2. When the operating element 1 is pressed, the switching mat 26 closes contacts on the printed circuit board 2 in a known fashion. The switching mat 26 has an electrically conductive surface coating 27 establishing a contact between a top of the switching mat 26 and an underside of the switching mat. The conductive surface coating is connected both to the conductive subregion 25 of the operating element 1 and to the printed circuit board 2, so that an electrically conductive connection is ensured between the conductive subregion 25 acting as sensor element and the printed circuit board 2. In addition, this exemplary embodiment has a light-emitting diode 28 arranged on the printed circuit board 2 in order to illuminate the operating element. A light-emitting diode of this kind may also be provided for all the preceding exemplary embodiments.

Figure 7:
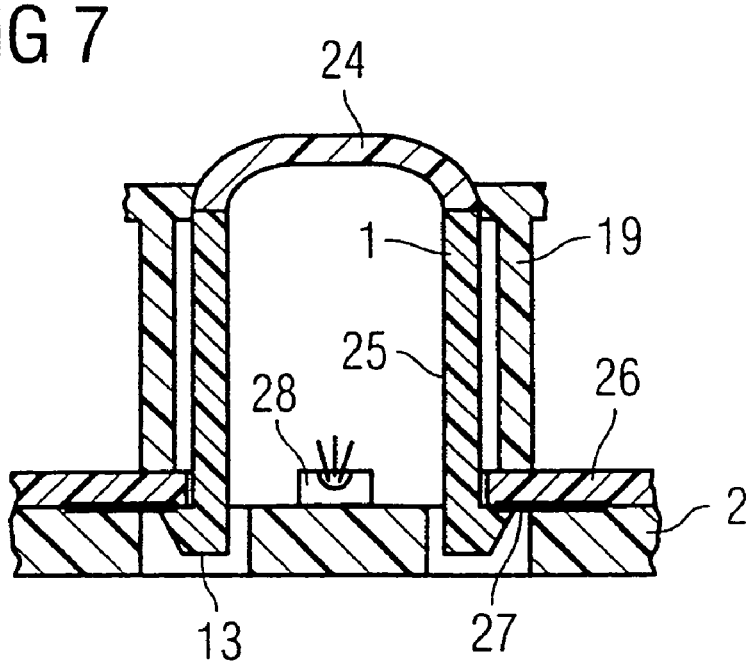
FIG. 7 is a sectional view of a seventh embodiment of a pushbutton switch with a coated switching mat according to the invention.

FIG. 7 shows another embodiment, in which the operating element has a nonconductive subregion 24 and a conductive subregion 25, as in the case of the embodiment shown in FIG. 6. On the printed circuit board 2, a switching mat 26 is arranged whose side facing the printed circuit board 2 has an electrically conductive surface coating 27. The conductive subregion 25 of the operating element 1 now likewise rests against this conductive surface coating 27 of the switching mat 26, so that the conductive surface coating of the switching mat 26 ensures that a contact is established between the conductive subregion 25 of the operating element 1 acting as sensor element and the printed circuit board 2 in the position in which the operating element 1 is at rest. In this embodiment, the operating element 1 projects into an opening 13 in the printed circuit board 2. An LED 28 arranged on the printed circuit board 2 again allows the operating element to be illuminated.

Various examples have been illustrated to show how a capacitive proximity sensor element formed by an electrically conductive region of an operating element can be in reliable contact with a printed circuit board, wherein the sensor element likewise hardly restricts the integration of further components into the operating element and may additionally perform the function of other components of a pushbutton switch.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is

1. A control element comprising:
a printed circuit board;
an operating element for operating the control element; and
an electrically conductive sensor element of a capacitive proximity sensor integrated in the operating element and fixedly connected along a vertically arranged side wall of the operating element, electrically and contactingly connected to the printed circuit board;
wherein the control element is a pushbutton switch, and the operating element is linearly movably mounted relative to the printed circuit board.

2. The control element of claim 1, wherein the sensor element comprises one of an angled, elastically deformable metal element or a metal-coated plastic element, said sensor element having first and second legs, the first leg projecting into the operating element and fixedly connected thereto, and the second leg being supported on a conductive face of the printed circuit board on a side of the printed circuit board which faces the operating element.

3. The control element of claim 1, wherein the sensor element comprises an angled, elastically deformable metal element having first and second legs, the first leg being fixedly connected to the printed circuit board, and the second leg acting resiliently on an inner front portion of the operating element.

4. The control element of claim 1, wherein the sensor element is formed as a portion of the operating element, the portion being provided with a metal coating and projecting through the printed circuit board and, in a position in which the operating element is at rest, rests against a conductive face on a side of the printed circuit board which is remote from the operating element.

5. The control element of claim 1, wherein the sensor element is a metal coating arranged on an internal surface of the operating element, the control element further comprising a sliding contact element fixedly connected to the printed circuit board and providing the electrical connection between the metal coating and the printed circuit board.

6. The control element of claim 1, wherein the printed circuit board has a metal-coated recess, the sensor element is fixedly connected to the operating element, and a subregion of the sensor element projecting into the metal-coated recess in the printed circuit board and rests against the printed circuit board.

7. The control element of claim 6, wherein the sensor element is formed as a metal element or metal-coated plastic element.

8. The control element of claim 1, wherein the sensor element is formed as a conductive subregion of the operating element, the control element further comprising a switching element including a switching mat arranged on the printed circuit board, the switching mat having an electrically conductive layer which is connected both to the conductive subregion of the operating element and to the printed circuit board.

9. The control element of claim 8, wherein the operating element engages a side of the switching mat opposite to the operating element, and the conductive subregion of the operating element, in a position in which the control element is at rest, rests against the electrically conductive layer of the switching mat.

10. The control element of claim 1, wherein the sensor element is arranged such that a capacitance between the sensor element and an element of the printed circuit board changes when a user's hand approaches the operating element.

11. The control element of claim 1, wherein the electrical contact between the conductive sensor element of the capacitive proximity sensor and the printed circuit board forms a resistive connection.

12. A control element comprising:
a printed circuit board;
an operating element for operating the control element; and
an electrically conductive sensor element of a capacitive proximity sensor integrated in the operating element and electrically conductively connected to the printed circuit board, the sensor element comprising one of an angled, elastically deformable metal element or a metal-coated plastic element, and first and second legs, the first leg projecting into the operating element and fixedly connected thereto, and the second leg being supported on a conductive face of the printed circuit board on a side of the printed circuit board which faces the operating element.

13. A control element comprising:
a printed circuit board;
an operating element for operating the control element; and
an electrically conductive sensor element of a capacitive proximity sensor integrated in the operating element, electrically and contactingly connected to the printed circuit board;
wherein the control element is a pushbutton switch, and the operating element is linearly movably mounted relative to the printed circuit board; and
wherein the sensor element comprises one of an angled, elastically deformable metal element or a metal-coated plastic element, said sensor element having first and second legs, the first leg projecting into the operating element and fixedly connected thereto, and the second leg being supported on a conductive face of the printed circuit board on a side of the printed circuit board which faces the operating element.

* * * * *